United States Patent [19]

Yaklin

[11] Patent Number: 5,517,134

[45] Date of Patent: May 14, 1996

[54] OFFSET COMPARATOR WITH COMMON MODE VOLTAGE STABILITY

[75] Inventor: Daniel A. Yaklin, Garland, Tex.

[73] Assignee: Texas Instruments Incorporated, Dallas, Tex.

[21] Appl. No.: 307,140

[22] Filed: Sep. 16, 1994

[51] Int. Cl.[6] .................................................. H03K 5/22
[52] U.S. Cl. .......................... 327/65; 327/63; 327/68; 327/77; 327/307
[58] Field of Search .................................. 327/50, 51, 52, 327/53, 54, 73, 77, 307, 63, 64, 65, 68, 69; 330/252, 253, 255

[56] References Cited

U.S. PATENT DOCUMENTS

| | | | |
|---|---|---|---|
| 4,103,190 | 7/1978 | Beutler | 307/362 |
| 4,245,170 | 1/1981 | Verhoeven | 307/360 |
| 4,598,215 | 7/1986 | Schechtman et al. | 307/355 |
| 4,602,168 | 7/1986 | Single | 307/355 |
| 4,717,838 | 1/1988 | Brehmer et al. | 307/355 |
| 4,965,468 | 10/1990 | Nicollini et al. | 307/362 |
| 5,043,599 | 8/1991 | Zitta | 307/355 |
| 5,311,085 | 5/1994 | Pelgrom et al. | 307/494 |
| 5,369,319 | 11/1994 | Good et al. | 327/73 |
| 5,386,207 | 1/1995 | Lin | 340/146.2 |

Primary Examiner—Timothy P. Callahan
Assistant Examiner—Kenneth B. Wells
Attorney, Agent, or Firm—Warren L. Franz; Wade James Brady, III; Richard L. Donaldson

[57] ABSTRACT

A comparator (10) has voltage input terminals (20, 22) connected to control current flow through paths (33, 34) of first and second matched pair transistors (16, 18), and output terminals (41, 42) of an offset current control subcircuit (43) connected to control current flow through parallel paths (44, 45) of third and fourth matched pair transistors (38, 39). Subcircuit (43) includes a first voltage follower (47) connected to cause the common mode of an offset voltage differential applied at terminals (41, 42) to track the input common mode voltage applied at terminals (20, 22), and a second voltage follower (48) connected to define the value of the offset voltage differential according to a voltage applied at a reference voltage node (62). In described embodiments, follower (47) is an operational amplifier having an input connected to a central node (60) of a series resistor coupling voltage divider (58, 59) connected across terminals (20, 22) and an output connected to control voltage at a corresponding central node (56) of another series resistor coupling voltage divider (51, 52) connected across terminals (41, 42). Follower (48) is an operational amplifier having an input connected to a reference voltage terminal (62) and an output connected to control the voltage differential across terminals (41, 42).

20 Claims, 2 Drawing Sheets

OFFSET COMPARATOR WITH COMMON MODE VOLTAGE STABILITY

This invention relates to offset comparators in general; and, in particular, to a differential offset comparator providing a constant differential offset voltage over a varying input common mode voltage input signal.

BACKGROUND OF THE INVENTION

A comparator is an electrical circuit that provides an output electrical signal which is a function of the difference in magnitudes of electrical signals applied respectively to a plurality of circuit input terminals. A typical comparator may, for example, comprise an output terminal, first and second input terminals, and an electrical circuit connecting said output and input terminals to provide a "hi" or "lo" voltage at the output terminal whenever the voltage at the first input terminal equals or exceeds the voltage at the second input terminal, and a "lo" or "hi" voltage at the output terminal in all other cases. The term "offset comparator" refers to a species of comparators wherein the shift from "hi" to "lo" (or "lo" to "hi") occurs when one of the input voltages (or currents) equals or exceeds the other by a pre-established threshold reference voltage (or current) amount. The term input "common mode" voltage (or current) refers to the average of the voltages (or currents) present at the input terminals. Because of intentional and/or unintentional fluctuations in input voltages (or currents), comparators are designed to work over some given range of common mode voltages (or currents). The term "voltage" used in reference to input and output voltages hereafter will be understood to cover input and output voltages, or alternatively input and output currents.

There is a problem with conventional offset designs in maintaining a desired offset voltage over a wide range of input common mode voltages. This is because conventional offset reference voltages are set without being tied directly to the input voltages themselves. Ideally, the offset values should remain constant despite fluctuations in input common mode voltage. However, conventional offset voltage circuits behave nonlinearly, so are subject to deviations due to variations in input common mode voltages.

SUMMARY OF THE INVENTION

It is an object of the present invention to provide a differential offset comparator electrical circuit having good offset voltage stability over a wide range of input common mode voltages.

It is a further object of the invention to provide an offset voltage control subcircuit for a differential offset comparator circuit, wherein the offset voltage is dynamically and automatically set to compensate for changes in input common mode voltage.

In accordance with the invention, a comparator circuit has first and second input terminals connected to an output terminal by circuit means for delivering an electrical signal at the output terminal indicative of the relative magnitudes of input voltages applied to the input terminals, offset by an offset voltage amount. The circuitry includes means for setting the reference offset voltage dependent on the average or "common mode" of the applied input voltages.

In embodiments described in greater detail below, a pair of matched first and second transistors have first terminals coupled through an output switching subcircuit to a first power supply terminal, second terminals respectively coupled to the first and second input terminals, and third terminals coupled through a common current source to a second power supply terminal. A second pair of matched third and fourth transistors have first terminals respectively coupled to the first terminals of the first and second transistors, second terminals, and third terminals coupled through a common current source to the second power supply terminal. A voltage offset control subcircuit, coupled to determine the input common mode voltage applied at said first and second input terminals and coupled to a reference voltage node, functions to provide an offset voltage differential across the second terminals of the third and fourth transistors. The voltage offset control subcircuit is configured to provide an offset voltage differential having a value determined by the voltage applied at the reference voltage node and a common mode voltage determined by the input common mode voltage.

In a particular implementation, the voltage offset control subcircuit includes a first operational amplifier having a feedback loop for setting a central node of a series resistance coupling voltage divider connected across the third and fourth transistor second terminals, to track the voltage at a corresponding central node of a similar series resistance coupling voltage divider connected across the first and second input terminals. A second operational amplifier has a feedback loop for setting the offset voltage differential applied across the third and fourth transistor second terminals, in accordance with a reference voltage applied to the second operational amplifier. By applying an offset by means of a matched second transistor pair and by furnishing an offset voltage having an offset common mode voltage that tracks variances in the input common mode voltage, the invention provides an offset differential comparator wherein unwanted variations in offset due to circuit nonlinearities are minimized.

BRIEF DESCRIPTION OF THE DRAWINGS

Embodiments of the invention have been chosen for purposes of illustration and description, and are shown with reference to the accompanying drawings, wherein.

Throughout the drawings, like elements are referred to by like numerals.

DETAILED DESCRIPTION OF PREFERRED EMBODIMENTS

Figure 1:
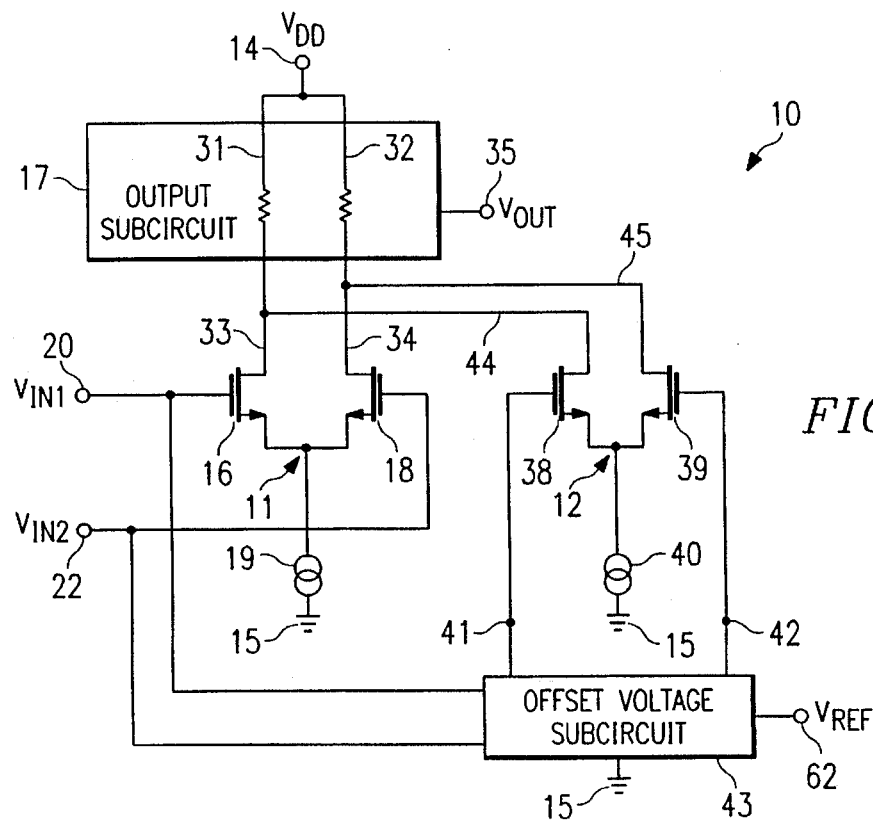
FIG. 1 is block diagram of a comparator electrical circuit in accordance with the invention.
Figure 2:
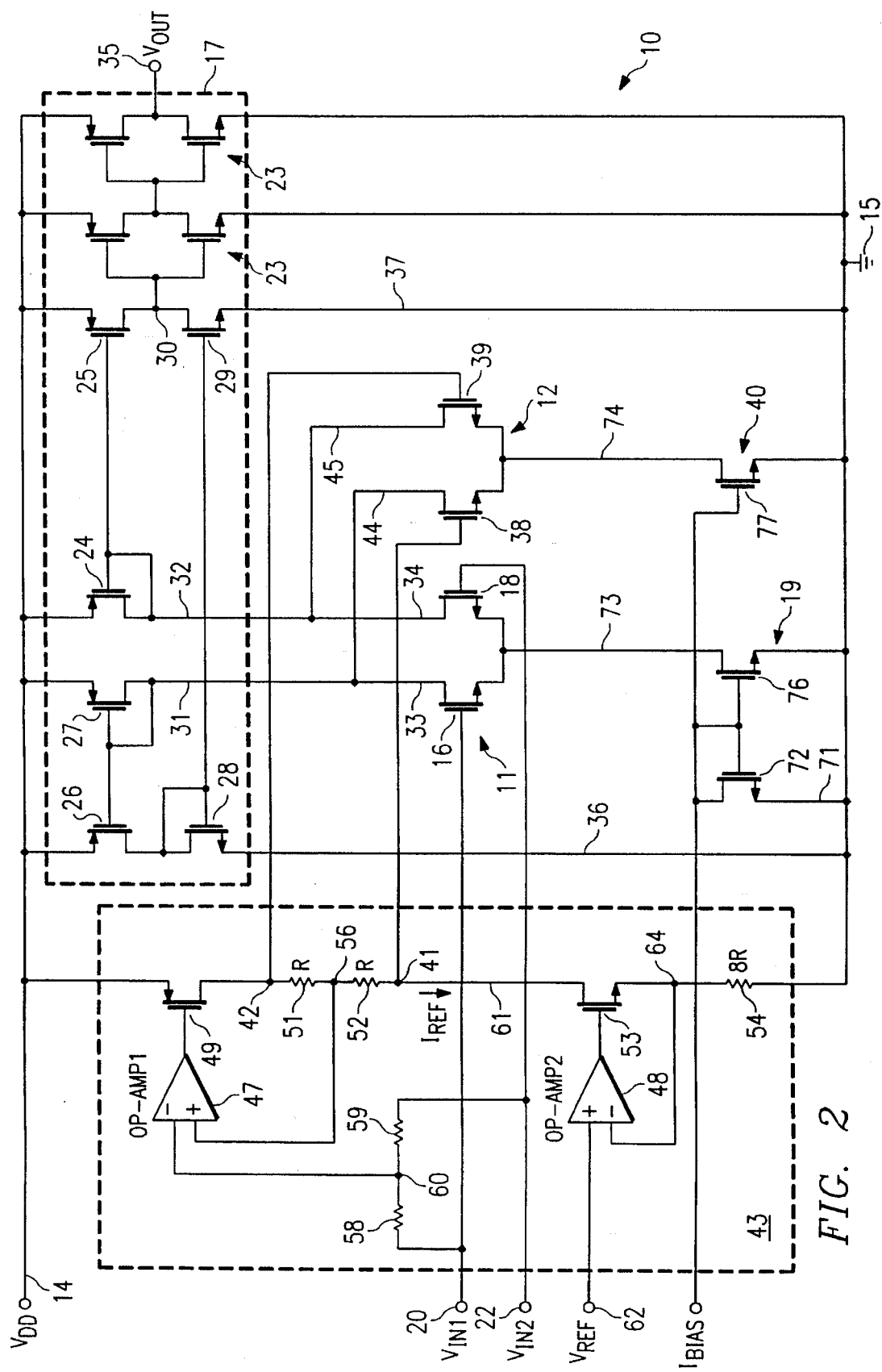
FIG. 2 is a schematic diagram of one form of implementation of the comparator of FIG. 1.

The principles of the invention are illustrated, by way of example, with reference to a semiconductor integrated circuit comprising a constant differential offset voltage comparator 10, shown in FIGS. 1 and 2. Comparator 10 comprises first and second matched differential pairs 11, 12 of NMOS transistors connected in parallel between a higher voltage power supply terminal (voltage source $V_{DD}$) 14 and a lower voltage power supply terminal (ground) 15. Pair 11 includes transistor 16 having a drain coupled through an output switching subcircuit 17, to $V_{DD}$ terminal 14, a source coupled through a current source (viz. sink) 19 to ground terminal 15, and a gate coupled to receive a first input voltage signal from a first input terminal ($V_{IN1}$) 20. Pair 11 also includes a matched second transistor 18 having a drain coupled through subcircuit 17 to $V_{DD}$, a source coupled through the same current source 19 to ground, and a gate connected to receive a second input voltage signal from a second input terminal ($V_{IN2}$) 22. Circuit 10 functions so that with equal voltages applied to the gates, equal voltages will result on the drains and equal current will flow through transistors 16 and 18.

Output switching subcircuit 17 is connected between $V_{DD}$ and the drains of transistors 16, 18. As shown in FIG. 2, subcircuit 17 may comprise two pairs of PMOS transistors and one pair of NMOS transistors connected in mirrored arrangement, to provide equal source-to-drain current paths for output switching purposes. The pairs are respectively made up of transistors 24, 25; 26, 27; and 28, 29. One transistor (24, 27, 28) of each mirrored pair has its drain connected to its gate in diode fashion. PMOS transistor 24 has its source connected to $V_{DD}$, and its drain/gate connected to the drain of transistor 18. PMOS transistor 25 has its source connected to $V_{DD}$, its gate connected to the drain/gate of transistor 24, and its drain connected to a first stage output node 30. PMOS transistor 26 has its source connected to $V_{DD}$. PMOS transistor 27 has its source connected to $V_{DD}$ and its drain/gate connected to the gate of transistor 26 and the drain of transistor 16. NMOS transistor 28 has its source connected to ground and its drain/gate connected to the drain of transistor 26. NMOS transistor 29 has its source connected to ground, its gate connected to the drain/gate of transistor 28, and its drain connected to the first stage output node 30. Equal current flowing through current paths 31, 32 (FIG. 2) that feed current paths 33, 34 of matched pair subcircuit 11 will cause equal current to flow through current paths 36, 37 of output switching subcircuit 17. The mirrored transistor pairs 28, 29 and 24, 25, however, function to change the current in path 371, whenever current flowing in path 32 differs from current flowing in path 31. This occurs whenever the voltage at input terminal ($V_{IN2}$) 22 differs from the voltage at input terminal ($V_{IN1}$) 20 by a given offset amount, determined as discussed below. Current mismatch operates so that only the smaller of the currents in paths 31 and 32 flows in path 37. When current in path 32 exceeds current in path 31, the path 31 current flows through path 37. In this case, transistor 25 operates in the triode region to reduce resistance across transistor 25, while transistor 29 operates in the saturation region, so that a "hi" voltage (closer to $V_{DD}$) appears at node 30. When current in path 32 is less than current in path 31, the path 32 current flows through path 37. In this case, transistor 29 operates in the triode region to reduce resistance across transistor 29 while transistor 25 operates in the saturation region, so that a "lo" voltage (closer to the ground) appears at node 30. The voltage at node 30 is amplified through one or more output stage amplifiers 23, to steepen the transfer function and generate a corresponding saturated "hi" or "lo" voltage at a final stage comparator output terminal ($V_{OUT}$) 35.

Matched pair 12 functions to provide a desired offset voltage to the comparator operation of matched pair 11. Subcircuit 12 includes NMOS transistors 38, 39, having their sources commonly coupled through a current source (viz. sink) 40 to ground, their drains respectively coupled to the drains of transistors 16, 18, and their gates respectively coupled to output terminals 41, 42 of an offset voltage control subcircuit 43. Subcircuits 12 and 43 operate to require the application of an additional voltage to one of the comparator input terminals 20, 22 in order to achieve an equal current flow through current paths 31, 32. This is because current paths 31, 32 now not only feed current paths 33, 34 of matched pair subcircuit 11, but also feed current paths 44, 45 of matched pair subcircuit 12. Thus, a voltage offset differential applied at nodes 41, 42 across the gates of transistors 38, 39, requires the application of an equal but opposite voltage differential applied at input terminals 20, 22 to obtain equal current flow through paths 31, 32.

To minimize adverse effects due to transistor nonlinearities on the comparison and voltage offset application processes, currents are matched in sources 19 and 40 and transistor parameters (e.g., topography lengths and widths) of transistors 16, 18 and 38, 39 of each pair 11 and 12 are not only matched with each other, but are also matched with the transistors of the other pair. These effects are further reduced in accordance with the invention, by applying the offset voltage to terminals 41, 42 in a way which tracks the common mode voltage applied at input terminals 20, 22.

In accordance with the invention, offset voltage control subcircuit 43 provides a predetermined reference voltage across terminals 41, 42 which tracks the input common mode voltage at nodes 20, 22 over a wide range of input common mode voltages. Subcircuit 43 comprises means for applying a voltage differential across terminals 41, 42 that has a value set in accordance with a predetermined reference voltage and a common mode voltage set in accordance with the input common mode voltage.

The embodiment of subcircuit 43, shown in FIG. 2, includes two operational amplifiers 47, 48 which function to maintain constancy in a voltage divider coupling comprising PMOS transistor 49, serially-connected identical resistors 51, 52, NMOS transistor 53 and resistor 54. The latter elements 49, 51, 52, 53, and 54 are all serially connected in succession between $V_{DD}$ and ground.

Resistors 51, 52 are equal valued resistors having first ends respectively connected to the offset voltage application terminals 41, 42 and second ends commonly connected at a central node 56. Operational amplifier 47 functions as a voltage follower to control switching of transistor 49 to maintain the voltage at node 56 at the common mode voltage of input terminals 20, 22. A second voltage divider, comprising serially-connected identical resistors 58, 59 has a central node 60 which is connected to provide the input common mode voltage (average of voltages at terminals 20, 22) as an input to the inverting ("−") terminal of operational amplifier 47. The non-inverting ("+") terminal of operational amplifier 47 is connected to node 56. The output of operational amplifier 47 is connected to the gate of transistor 49, whose source is connected to $V_{DD}$ and whose drain is connected to resistor 51 at terminal 42. Operational amplifier 48 functions as a voltage follower to apply a reference voltage across resistor 54; and, thus, maintains a corresponding constant current through the current path 61. A desired reference voltage of given magnitude (e.g.0.5 volts) is applied at a reference voltage terminal 62 to the non-inverting ("+") input of operational amplifier 48. The inverting ("−") input of operational amplifier 48 is connected to a first end (i.e., the high voltage end) of resistor 54 at node 64. The output of operational amplifier 48 is connected to the gate of transistor 53, whose source is connected to the first end of resistor 54 at node 64 and whose drain is connected to the first end of resistor 52 at offset voltage terminal 41. The second end of resistor 54 is connected to ground.

Because operational amplifier 48 functions to maintain the voltage at node 64 equal to the reference voltage applied at terminal 62, a corresponding constant current of predetermined magnitude (e.g., $I_{REF}=V_{REF}/8R$) will be maintained in path 61. Thus, the same current I will flow through, and a corresponding voltage differential will be applied across, the serial connection of resistors 51, 52 between terminals 41, 42 ($\Delta V_{OFFSET}=I_{REF}\cdot 2R$). That voltage ($\Delta V_{OFFSET}$) is, thus, equal to the product of the voltage applied across resistor 54 and the ratio of the sum of the values of the resistances of resistors 51, 52 divided by the value of the resistance of resistor 54. For the illustrated case, wherein resistor 52 has a resistance value which is four times that of the sum of resistors 51 and 52, a 0.5-volt reference voltage applied at terminal 62 will result in a 0.125-volt offset voltage differential applied across terminals 41, 42 [$\Delta V_{OFFSET}=V_{REF}\cdot 2R/8R=(0.5)\cdot(1/4)=0.125$].

Operational amplifier 47 functions to increase or decrease the source-to-drain resistance of transistor 49 and to compensate variations in the input to the inverting ("−") terminal of operational amplifier 47. This maintains a common mode of voltages applied at terminals 41, 42 that tracks the common mode of voltages applied to the input terminals 20, 22. Operational amplifier 48, on the other hand, works in tandem with the correction applied at operational amplifier 47 by varying the effective resistance of transistor 53 to maintain the voltage applied across resistor 54 (i.e. at node 64). In this way, the operational amplifiers 47, 48 function to remove the effects of nonlinearities due to input common mode voltage variations out of the system. Each adjusts independently of the other to maintain a desired offset voltage and common mode voltage across terminals 41, 42 which is matched to the input voltages applied at terminals 20, 22. Operational amplifier 48 controls transistor 53 to keep the current through path 61 constant; operational amplifier 47 controls transistor 49 to keep the offset common mode voltage the same as the input common mode voltage.

Figure 3:
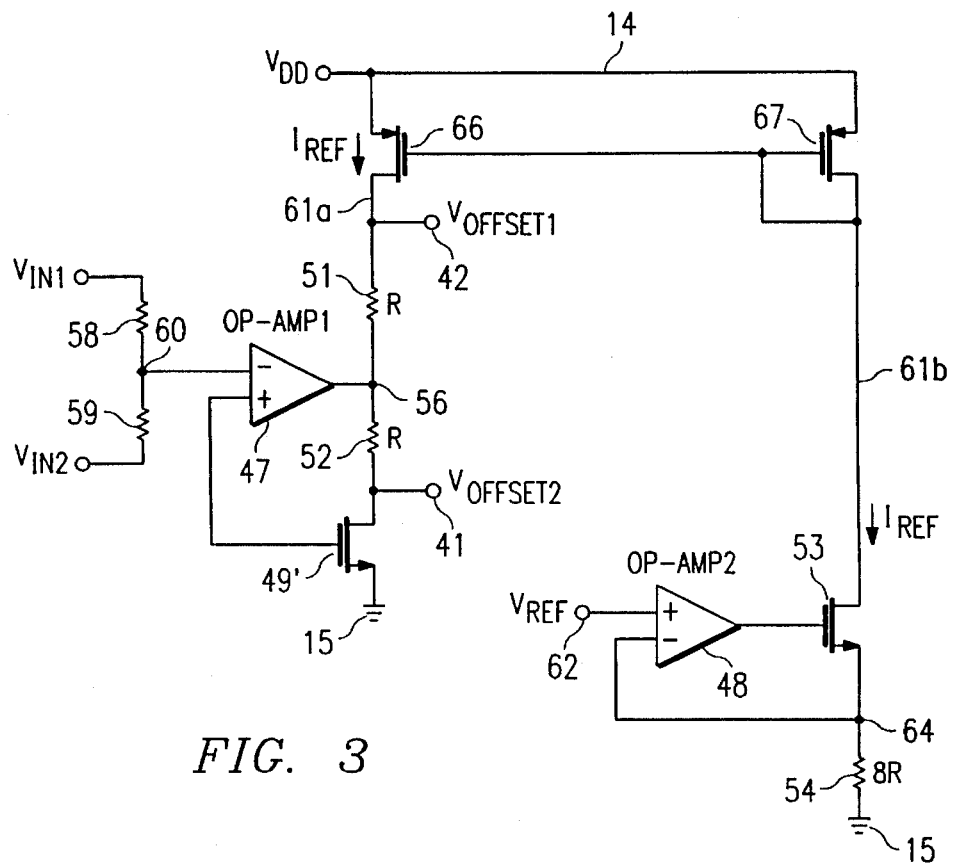
FIG. 3 is a modified form of the offset voltage control subcircuit component of the comparator of FIG. 2.

FIG. 3 shows an alternative implementation 43' of the subcircuit 43, wherein the serial path 61 is split into two parallel paths 61a and 61b, one of which includes the common mode setting elements and the other of which includes the offset voltage difference setting elements. The two paths 61a and 61b are coupled by means of a current mirroring arrangement of transistors 66, 67, so that the same current ($I_{REF}=V_{REF}/8R$) set by operational amplifier 48 to apply $V_{REF}$ across resistor 54 in path 61b will flow also through the resistors 51, 52 whose common mode voltage at node 56 is set by operational amplifier 47 in path 61a. Thus, again, the magnitude of the offset voltage differential across terminals 41, 42 will be determined by the value of the reference voltage $V_{REF}$ applied at reference voltage terminal 62 as an input to operational amplifier 48, and the value of the offset common mode voltage will be determined by the input common mode voltage applied at voltage divider node 60 as an input to operational amplifier 47.

It should be understood that, though the foregoing illustrative embodiments have been described with reference to MOSFET technology, the same principles are equally applicable to other transistor and equivalent component technologies; including, but not limited to, other field effect transistor technologies and to bipolar transistor technologies. The terms "source", "drain" and "gate" are used merely for reference purposes to identify the various terminals of the described transistors. It is to be recognized that the "drain" and "source" terminals of certain field effect transistors may be interchangeable; and that those terms are intended to encompass "emitter", "collector" and "base"; "cathode", "anode" and "grid"; or equivalent terms; as may be applicable for corresponding elements of other technologies.

The current sources 19, 40 may take any suitable form and are advantageously implemented by means of parallel current mirrors, tied to a fixed input bias current $I_{BIAS}$, as shown in FIG. 2. The illustrated arrangement is a negative source or "sink", having a first current path 71 established by a diode-connected NMOS transistor 72, having its source connected to ground, and its drain and gate connected to $I_{BIAS}$. Each corresponding path 73, 74, respectively coupling the matched transistor pair subcircuits 11 and 12 to ground, has a corresponding matched NMOS transistor 76, 77, with source connected to ground, gate connected to the gate-drain connection of transistor 72, and drain connected to sources of the respective paired transistors 16, 18 and 38, 39. With matched transistors 76, 77 thus connected, identical current will flow in the current paths 73, 74; and the output voltage appearing at $V_{OUT}$ terminal 35 will depend on how the currents in current paths 73, 74 divide out in paths 33, 34 and 44, 45 to cause a current differential between paths 31, 32.

It should also be understood that the use of $V_{DD}$, $V_{REF}$, ground, etc., are illustrative only, and that implementations using dual power sources and the like are equally possible. Moreover, though the reference voltage terminal 62 is illustrated as a terminal for receiving an externally applied reference voltage, it is not necessary that the reference voltage be applied externally and an internally developed reference voltage will also suffice.

Those skilled in the art to which the invention relates will appreciate that yet other substitutions and modifications can be made to the described embodiments, without departing from the spirit and scope of the invention as described by the claims below.

What is claimed is:

1. A comparator circuit, comprising:

first and second input terminals for respectively receiving first and second input voltage signals;

an output terminal;

first and second power supply terminals;

a reference voltage terminal for receiving a reference voltage signal;

a first pair of transistors comprising a first transistor having a first terminal coupled to said first power supply terminal, a second terminal coupled to said first input terminal and a third terminal; and a second transistor having a first terminal coupled to said first power supply terminal, a second terminal coupled to said second input terminal, and a third terminal;

a first current source coupled between said third terminals of said first and second transistors and said second power supply terminal;

a second pair of transistors comprising a third transistor having a first terminal coupled to said first power supply terminal a second terminal, and a third terminal; and a fourth transistor having a first terminal coupled to said first power supply terminal, a second terminal, and a third terminal;

a second current source coupled between said third terminals of said third and fourth transistors and said second power supply terminal;

means, coupled to said first and second input terminals and to said reference voltage terminal, for applying first and second offset voltage signals respectively to said second terminals of said third and fourth transistors; with said first and second offset voltage signals being applied with a voltage difference set by said reference votage signal applied at said reference voltage terminal; and said first and second offset voltage signals being applied with an average voltage set by the average voltage of said first and second input voltage signals; and output stage means, coupled to said first and second transistor pairs and to said output terminal, for generating an output voltage signal at said output terminal which is indicative of relative values of said first and second input voltage signals, offset by an amount determined by said first and second offset voltage signals.

2. A comparator as defined in claim 1, wherein said means for applying first and second offset voltage signals comprises a first voltage divider coupled to said first and second input terminals and having a first node; a second voltage divider coupled to said second terminals of said third and fourth transistors and having a second node; and voltage follower means coupled to said first and second nodes for causing voltage at said second node to be set by voltage at said first node.

3. A comparator as defined in claim 2, wherein said voltage follower means comprises an operational amplifier having a first input terminal coupled to said first node and a second input terminal coupled to said second node.

4. A comparator as defined in claim 3, wherein said voltage follower means further comprises a transistor having a first terminal coupled to said first power supply terminal, a second terminal coupled to an output terminal of said operational amplifier, and a third terminal coupled to said second voltage divider.

5. A comparator as defined in claim 4, wherein said second voltage divider comprises:

a first resistor having a first end connected to said third terminal of said voltage follower means transistor and said second terminal of one of said third and fourth transistors, and a second end connected to said second node; and a second resistor having a first end connected to said second node and a second end connected to said second terminal of the other of said third and fourth transistors.

6. A comparator as defined in claim 5, wherein said means for applying first and second offset voltage signals further comprises a third resistor coupled to said second terminal of said other of said third and fourth transistors and said second power supply terminal; and means, coupled to said reference voltage input terminal and said third resistor, for applying said reference voltage across said third resistor.

7. A comparator as defined in claim 6, wherein said means for applying said reference voltage across said third resistor comprises second voltage follower means coupled between said reference voltage terminal and one end of said third resistor.

8. A comparator as defined in claim 7, wherein said second voltage follower means comprises a second operational amplifier having a first input terminal coupled to said reference voltage input terminal, and a second input terminal coupled to said one end of said third resistor.

9. A comparator as defined in claim 8, wherein said second voltage follower means further comprises a transistor having a first terminal coupled to said second end of said second resistor, a second terminal coupled to an output terminal of said second operational amplifier, and a third terminal connected to said one end of said third resistor.

10. A comparator as defined in claim 2, wherein said voltage follower means comprises an operational amplifier having an input terminal coupled to said first node, and an output; and means, coupled to said output, for controlling voltage at said second node.

11. A comparator as defined in claim 10, wherein said means for applying first and second offset voltage signals further comprises:

a resistor;

a second operational amplifier having an input terminal coupled to said reference voltage terminal, and an output;

means coupled to said output for controlling current through said resistor; and means, coupled to said resistor, for causing current flow through said second voltage divider to be set by current flow through said resistor.

12. A comparator as defined in claim 1, wherein said first current source comprises a bias voltage input terminal and a current mirror subcircuit coupled between said bias voltage input terminal and said second power supply terminal.

13. A comparator as defined in claim 12, wherein said second current source comprises a second current mirror subcircuit coupled between said bias voltage input terminal and said second power supply terminal.

14. A comparator as defined in claim 1, wherein said comparator has a first current flow path for flow of current through said first and third transistors; a second current flow path for flow of current through said second and fourth transistors; and wherein said output stage means comprises means for converting a difference between said respective flows of current through said first and second current flow paths to a voltage signal at said output terminal.

15. A comparator as defined in claim 14, wherein said output stage means comprises first and second current mirror subcircuits, respectively coupled between said first and second transistor first terminals and said output terminal.

16. A comparator as defined in claim 15, wherein said first current mirror subcircuit comprises a first pair of mirroring transistors coupled between said first transistor and said first power supply terminal, said second current mirror subcircuit comprises a second pair of mirroring transistors coupled to said second transistor and said first power supply terminal, and said output stage means further comprises a third pair of mirroring transistors coupling said first and second pair of mirroring transistors.

17. A comparator circuit, comprising:

first and second transistors having first and second terminals respectively defining first and second current flow channels, and third terminals for respectively receiving first and second input voltage signals for controlling individual current flows through said first and second current flow channels;

third and fourth transistors having first and second terminals respectively defining third and fourth current flow channels, and third terminals for respectively receiving first and second offset voltage signals for controlling individual current flow through said third and fourth current flow channels;

current source subcircuitry coupled to said first, second, third and fourth transistors for flowing a first given combined current through said first and second current flow channels, and for flowing a second given combined current through said third and fourth current flow channels;

offset voltage control subcircuitry, coupled to said third terminals of said first and second transistors and to said third terminals of said third and fourth transistors, for applying first and second offset voltage signals to said third terminals of said third and fourth transistors in response to said first and second input voltages received at said third terminals of said first and second transistors, said offset voltage control circuitry being configured to apply said first and second offset voltage signals with an average voltage that is set by an average voltage of said first and second input voltage signals; and output stage subcircuitry, coupled to said first, second, third and fourth transistors, for generating a voltage output signal indicative of a comparison between the combined currents flowing in said first and third current flow channels and the combined currents flowing in said second and fourth current flow channels.

18. A comparator as defined in claim 17, wherein said first, second, third and fourth transistors are formed on a common semiconductor circuit element; and wherein said current source subcircuitry is configured to flow identical first and second given combined currents.

19. A comparator as defined in claim 17, wherein said offset voltage control subcircuitry comprises a first voltage divider coupled across said first and second transistor third terminals, a second voltage divider coupled across said third and fourth transistor third terminals, and voltage follower subcircuitry coupled to maintain identical common mode voltages of voltages applied at respective ends of said first and second voltage dividers.

20. An offset voltage control circuit for applying an offset voltage differential to a circuit having first and second voltage input terminals, said control circuit comprising:

a first series resistor coupling having opposite ends for respectively receiving first and second input voltage signals from said first and second voltage input terminals, and having a first node;

a second series resistor coupling having opposite ends for respectively delivering first and second offset voltage signals, and having a second node;

a first voltage follower coupling said first and second nodes for causing voltage at said second node to be set by voltage at said first node;

a reference voltage terminal for receiving a reference voltage signal;

a resistor;

a second voltage follower coupling said reference voltage terminal to said resistor to cause said reference voltage signal to be applied to said resistor to define a given reference current signal through said resistor; and current transfer subcircuitry, coupling said resistor to said second series resistor coupling, to cause said given reference current signal to flow through said second series resistor coupling, for setting an offset voltage differential between said first and second offset voltage signals based upon said reference voltage signal.

* * * * *